United States Patent
Kurokawa et al.

(10) Patent No.: US 12,052,009 B2
(45) Date of Patent: Jul. 30, 2024

(54) VIBRATOR DEVICE AND METHOD FOR MANUFACTURING VIBRATOR DEVICE

(71) Applicant: Seiko Epson Corporation, Tokyo (JP)

(72) Inventors: Kenichi Kurokawa, Suwa (JP); Naruki Teradaira, Matsumoto (JP); Katsuya Suzuki, Suwa (JP)

(73) Assignee: SEIKO EPSON CORPORATION (JP)

(*) Notice: Subject to any disclaimer, the term of this patent is extended or adjusted under 35 U.S.C. 154(b) by 345 days.

(21) Appl. No.: 17/454,872

(22) Filed: Nov. 15, 2021

(65) Prior Publication Data
US 2022/0158601 A1 May 19, 2022

(30) Foreign Application Priority Data
Nov. 16, 2020 (JP) .................... 2020-190123

(51) Int. Cl.
*H03H 9/24* (2006.01)
*H03H 3/007* (2006.01)

(52) U.S. Cl.
CPC ........ *H03H 3/0072* (2013.01); *H03H 9/2489* (2013.01)

(58) Field of Classification Search
CPC ............. H10N 30/2042; H03H 9/2489; H03H 9/02244; H03H 9/2468; H03H 9/2478; H03H 2009/02251
See application file for complete search history.

(56) References Cited

U.S. PATENT DOCUMENTS

| 10,418,967 | B2* | 9/2019 | Nakagawa | ............... H03H 3/02 |
| 2004/0187574 | A1* | 9/2004 | Hayashi | ............. G01C 19/5663 73/514.16 |
| 2010/0084948 | A1* | 4/2010 | Katoh | ................ H03H 9/02086 29/25.35 |
| 2010/0200543 | A1* | 8/2010 | Katoh | ...................... H03H 3/02 216/41 |
| 2018/0175794 | A1* | 6/2018 | Yamazaki | ............ H03H 3/0072 |
| 2020/0411746 | A1* | 12/2020 | Kurokawa | ............. H03H 9/125 |
| 2021/0028763 | A1* | 1/2021 | Kawai | .................... H10N 30/50 |

FOREIGN PATENT DOCUMENTS

JP 2001124561 A * 5/2001
JP 2018-101829 A 6/2018

* cited by examiner

*Primary Examiner* — J. San Martin
(74) *Attorney, Agent, or Firm* — Harness, Dickey & Pierce, P.L.C.

(57) ABSTRACT

A method for manufacturing a vibrator device including a base portion having a first surface, a support portion protruding from the first surface in a normal direction of the first surface, and a vibrating arm that extends from the support portion along the first surface and that has a gap with the first surface, the method including: preparing a single crystal silicon substrate having a flat plate shape; forming, by dry etching, at least two bottomed long grooves arranged at a predetermined interval on a second surface which is one surface of the silicon substrate; and forming the vibrating arm between the second surface and a bottom surface of the long groove in a thickness direction of the silicon substrate by wet etching side surfaces of the long groove and communicating the two long grooves with each other.

3 Claims, 13 Drawing Sheets

VIBRATOR DEVICE AND METHOD FOR MANUFACTURING VIBRATOR DEVICE

The present application is based on, and claims priority from JP Application Serial Number 2020-190123, filed Nov. 16, 2020, the disclosure of which is hereby incorporated by reference herein in its entirety.

BACKGROUND

1. Technical Field

The present disclosure relates to a vibrator device and a method for manufacturing the vibrator device.

2. Related Art

In related art, there has been known a vibrator having a micro-electro-mechanical systems (MEMS) structure in which an excitation unit including a piezoelectric thin film is formed on a silicon semiconductor layer. For example, JP-A-2018-101829 discloses a vibrator in which one end of each of plural vibrating arms is coupled to a base portion. The vibrator has a structure in which a silicon on insulator (SOI) substrate is used, two silicon oxide layers are laminated on a surface silicon layer serving as the vibrating arm, and an excitation unit is disposed on the silicon oxide layer. Further, JP-A-2018-101829 discloses that the vibrator has a reduced temperature coefficient of frequency (TCF) and good frequency-temperature characteristics by setting a ratio among a thickness of the surface silicon layer, a thickness of the first silicon oxide layer, and a thickness of the second silicon oxide layer to a predetermined condition.

However, since the vibrator disclosed in JP-A-2018-101829 is manufactured using an expensive SOI substrate, there is a problem in that it is difficult to reduce a price of the vibrator.

SUMMARY

A method for manufacturing a vibrator device including a base portion having a first surface of which a recessed portion is formed on a surface of the base portion, a support portion protruding from the first surface in a normal direction of the first surface, and a vibrating arm that extends from the support portion along the first surface and that has a gap with the first surface, includes: preparing a single crystal silicon substrate having a flat plate shape; forming, based on dry etching, at least two bottomed long grooves arranged at a predetermined interval on a second surface which is one surface of the silicon substrate; and forming the vibrating arm between the second surface and a bottom surface of the long groove in a thickness direction of the silicon substrate by wet etching side surfaces of the long groove and communicating the two long grooves with each other.

A vibrator device includes: a base portion having a first surface of which a recessed portion is formed on a surface of the base portion; a support portion protruding from the first surface in a normal direction of the first surface; a vibrating arm that extends from the support portion along the first surface and that has a gap with the first surface; and a piezoelectric film disposed at a second surface that is an opposite-side surface from a surface facing the first surface of the vibrating arm, in which the vibrating arm is made of a single crystal silicon substrate, the vibrating arm includes two side surfaces that are coupled to two ends of the second surface in a width direction of the vibrating arm, and the two side surfaces gradually approach each other as a distance from the second surface to the side surface increases.

DESCRIPTION OF EXEMPLARY EMBODIMENTS

1. First Embodiment 1.1 Vibrator Device

First, a vibrator device 1 according to a first embodiment will be described with reference to FIGS. 1, 2, and 3 by taking a three-leg tuning fork vibrator including three vibrating arms as an example.

For convenience of the description, in the following drawings except FIG. 10, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side in each axis is also referred to as a "plus side", a side opposite to the arrow is also referred to as a "minus side", a plus side in the Z direction is also referred to as "upper", and a minus side in the Z direction is also referred to as "lower".

Figure 1:
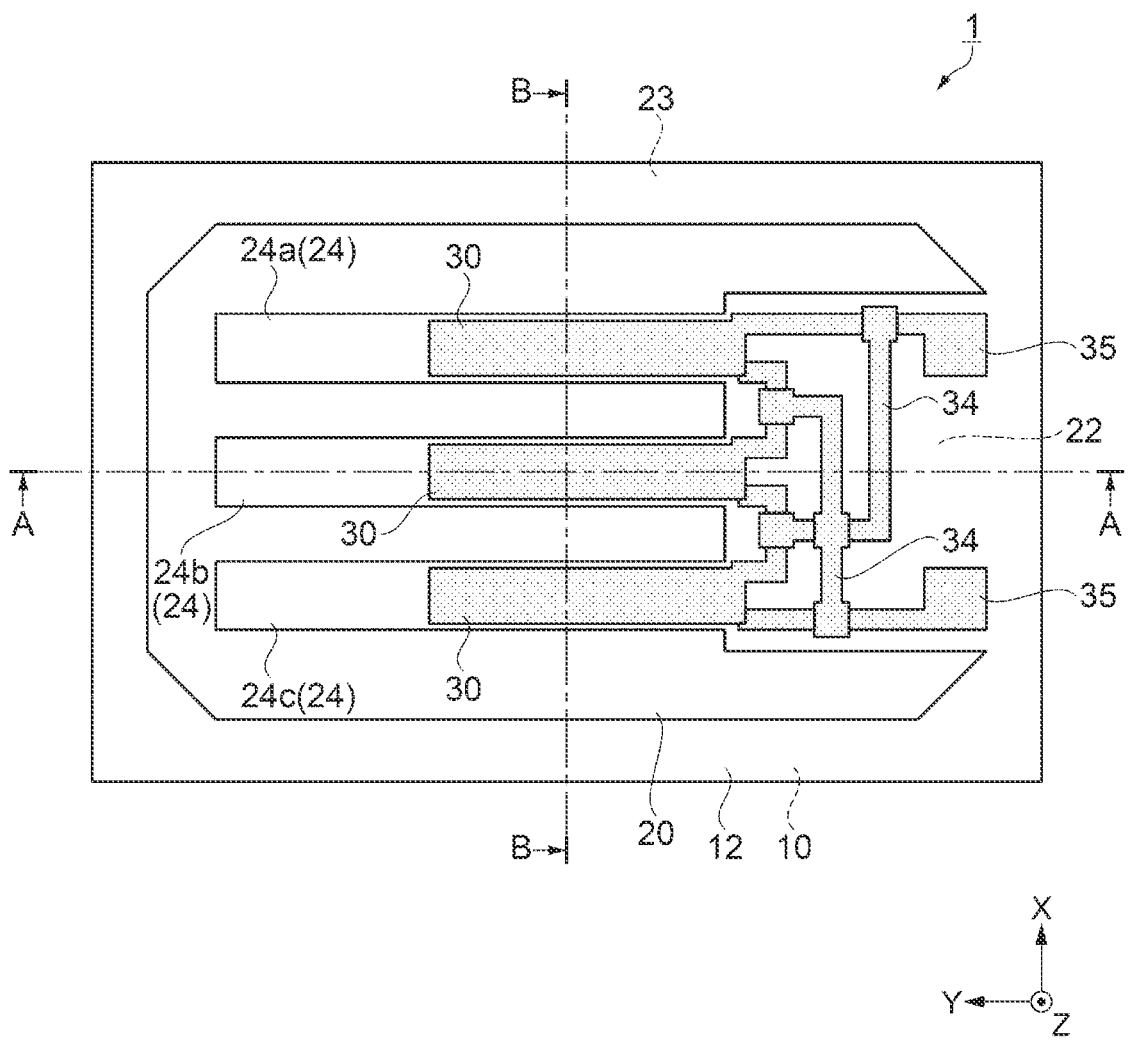
FIG. 1 is a plan view showing a schematic configuration of a vibrator device according to a first embodiment.
Figure 2:
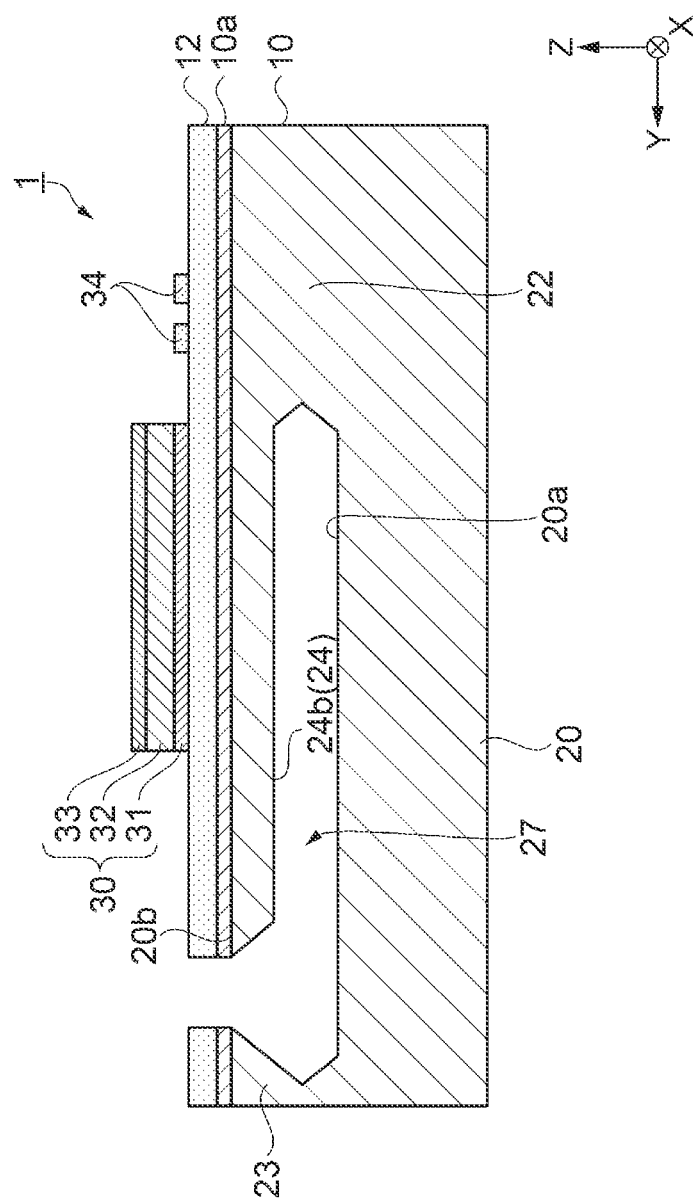
FIG. 2 is a cross-sectional view taken along a line A-A in FIG. 1.
Figure 3:
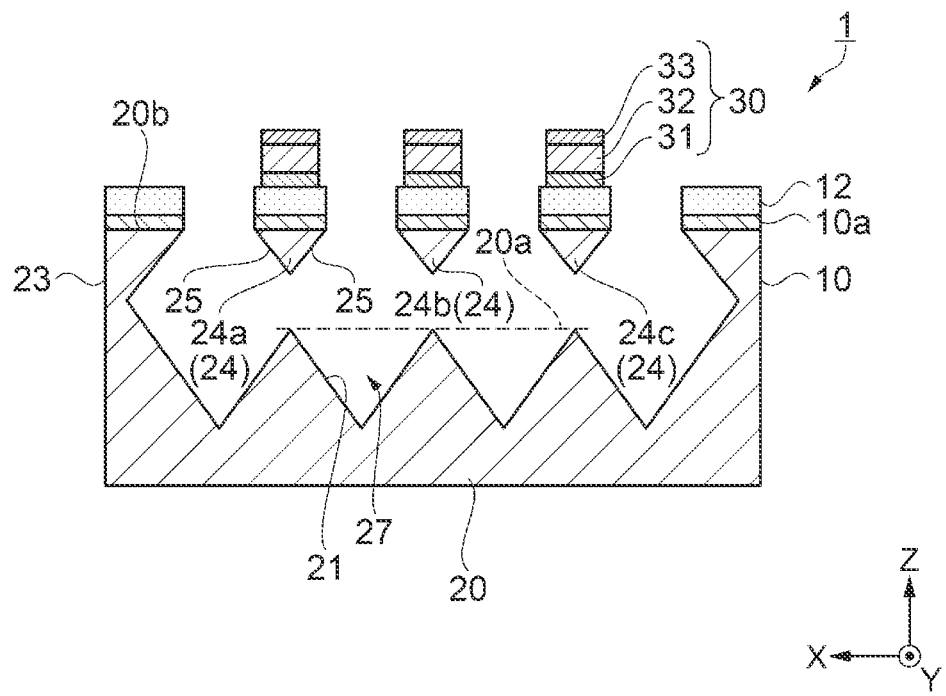
FIG. 3 is a cross-sectional view taken along a line B-B in FIG. 1.

As shown in FIGS. 1, 2, and 3, the vibrator device 1 includes a base portion 20, a support portion 22, three vibrating arms 24, a temperature characteristic adjusting film 12, and a piezoelectric drive unit 30. The base portion 20, the support portion 22, and the three vibrating arms 24 are formed of a single crystal silicon substrate 10.

The base portion 20 has a first surface 20a of which plural recessed portions 21 are formed on a surface of the base portion 20. The support portion 22 protrudes from the first surface 20a of the base portion 20 toward the plus side in the Z direction which is a normal direction of the first surface 20a. The three vibrating arms 24 have a gap with the first surface 20a of the base portion 20, and extend from the support portion 22 to a plus side in the Y direction along the first surface 20a.

In a plan view shown from the Z direction, a frame portion 23 surrounding the three vibrating arms 24 is provided, and the frame portion 23 is coupled to the support portion 22 and the base portion 20.

Each of the three vibrating arms 24 has two side surfaces 25 that are coupled to two ends of a second surface 20b in the X direction, which is a width direction of each vibrating arm 24, and the two side surfaces 25 gradually approach each other as a distance from the second surface 20b to the side surface 25 increases. That is, the vibrating arm 24 is formed in a triangular shape in a cross-sectional view from the Y direction which is an extending direction of the vibrating arm 24. The three vibrating arms 24 are arranged in the X direction in a plan view from the Z direction, and a first vibrating arm 24a, a second vibrating arm 24b, and a third vibrating arm 24c are arranged in this order from a plus side in the X direction on the second surface 20b which is one surface of the silicon substrate 10 along an XY plane specified by the X axis and the Y axis.

By disposing the temperature characteristic adjusting film 12 on the second surfaces 20b of the three vibrating arms 24, and setting a ratio of a thickness of the vibrating arms 24 to a thickness of the temperature characteristic adjusting film 12 to a predetermined condition, a temperature coefficient of frequency (TCF) can be reduced and the vibrator device 1 having good frequency-temperature characteristics can be formed. The temperature characteristic adjusting film 12 is a silicon oxide ($SiO_2$) film. An oxide film 10a is disposed between the second surface 20b of the silicon substrate 10 and the temperature characteristic adjusting film 12, and protects a region that is not to be etched when the silicon substrate 10 is subjected to an etching process. This oxide film 10a is a silicon oxide film formed by thermally oxidizing the silicon substrate 10.

The piezoelectric drive unit 30 is disposed at the second surface 20b that is an opposite-side surface from a surface facing the first surface 20a of the vibrating arm 24. The oxide film 10a and the temperature characteristic adjusting film 12 are disposed between the second surface 20b of the vibrating arm 24 and the piezoelectric drive unit 30.

The piezoelectric drive unit 30 has a laminated structure including a first electrode 31, a piezoelectric film 32, and a second electrode 33 that are provided on a second surface 20b side of the vibrating arm 24.

Plural wirings 34 are electrically coupled to the first electrode 31 and the second electrode 33 so as to vibrate the adjacent vibrating arms 24 in opposite phases. The plural wirings 34 are electrically coupled to electrode pads 35. Specifically, the first electrode 31 of the first vibrating arm 24a is electrically coupled to the second electrode 33 of the second vibrating arm 24b and the first electrode 31 of the third vibrating arm 24c via the wiring 34, and the second electrode 33 of the first vibrating arm 24a is electrically coupled to the first electrode 31 of the second vibrating arm 24b and the second electrode 33 of the third vibrating arm 24c via the wiring 34. By applying a voltage between the two electrode pads 35 from the outside, the adjacent vibrating arms 24 can be vibrated in opposite phases.

As a material forming these components, for example, the piezoelectric film 32 is made of aluminum nitride (AlN) or the like, the first electrode 31 and the second electrode 33 are made of titanium nitride (TiN) or the like, and the plural wirings 34 and the electrode pads 35 are made of aluminum (Al), copper (Cu) or the like.

When a voltage is applied between the first electrode 31 and the second electrode 33 via the two electrode pads 35, the piezoelectric film 32 accordingly expands and contracts and the vibrating arms 24 vibrate. The vibrating arms 24 perform, by the piezoelectric drive unit 30, flexural vibration in the Z direction orthogonal to the second surface 20b, that is, out-of-plane vibration in which the vibrating arms 24 displace in a direction not along the second surface 20b.

As described above, since the vibrator device 1 according to the present embodiment is formed of the inexpensive single crystal silicon substrate 10, the low-priced vibrator device 1 can be obtained.

1.2. Etching Characteristic

Next, etching characteristics of the silicon substrate 10 related to a manufacturing method of the vibrator device 1 will be described with reference to FIGS. 4 to 9.

In general, in wet etching using an alkaline aqueous solution (KOH, TMAH) performed on single crystal silicon, an etching rate varies depending on crystal plane orientations, and since a (111) plane is hardly etched as compared with a (100) plane and a (110) plane, the etching becomes an anisotropic process.

Figure 4:
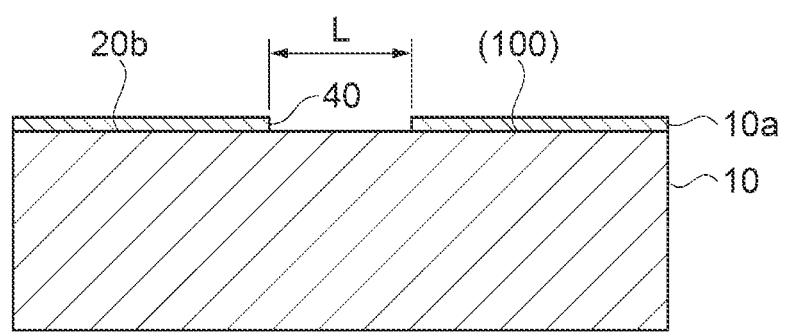
FIG. 4 is a cross-sectional view illustrating an etching characteristic of a silicon substrate.
Figure 5:
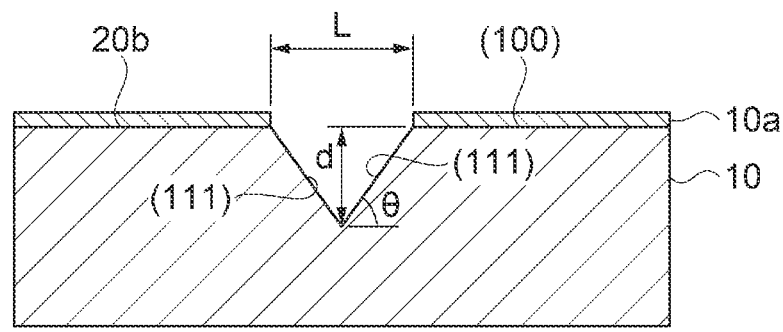
FIG. 5 is a cross-sectional view illustrating an etching characteristic of a silicon substrate.
Figure 5:
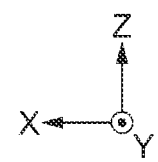

As shown in FIG. 4, in the single crystal silicon substrate 10 having an orientation flat (110) in a plane orientation (100), when an opening portion 40 is provided in the oxide film 10a serving as an etching protective film based on a photolithography technique and the wet etching is performed, as shown in FIG. 5, the (111) plane having an angle θ of 54.7 degrees with respect to the (100) plane is precipitated, and finally, two (111) planes come into contact with each other, so that the etching is stopped and the etching cannot be performed deeper.

When a length of the opening portion 40 is L, an etching depth d can be calculated by Formula (1).

$$d = (L/2) \times \tan 54.7 = 0.706 \times L \qquad (1)$$

Figure 6:
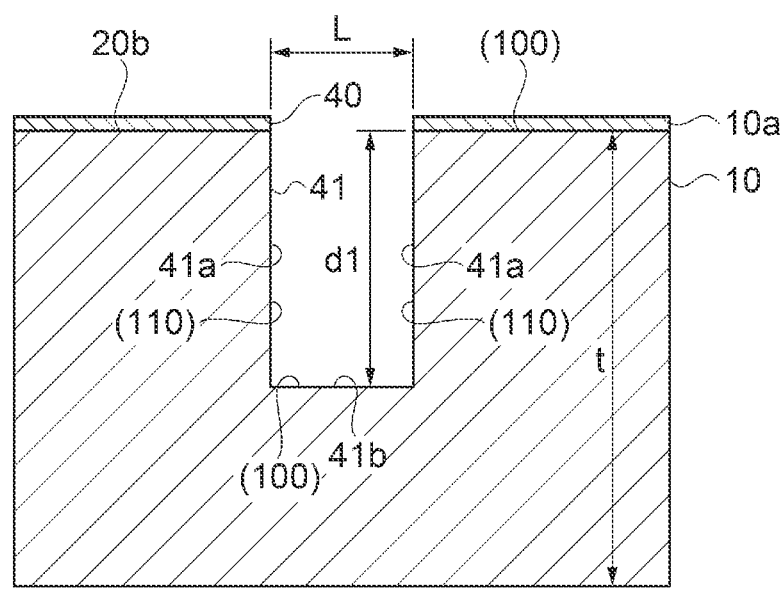
FIG. 6 is a cross-sectional view illustrating an etching characteristic of a silicon substrate having a long groove.
Figure 6:
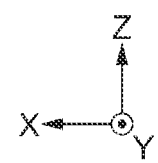
Figure 7:
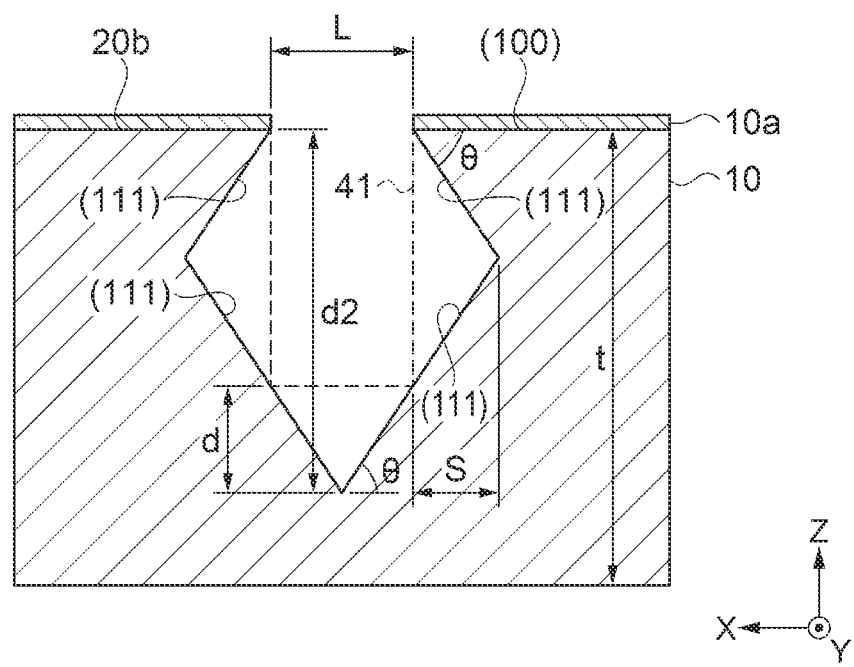
FIG. 7 is a cross-sectional view illustrating an etching characteristic of a silicon substrate having a long groove.

On the other hand, as shown in FIG. 6, when the silicon substrate 10 having the opening portion 40 with the length L in the oxide film 10a is vertically processed by dry etching to form a bottomed long groove 41 with a length d1 to a bottom surface 41b, the bottom surface 41b becomes the (100) plane and a side surface 41a becomes the (110) plane. When the wet etching is performed in this state, as shown in FIG. 7, the bottom surface 41b of the long groove is etched toward the minus side in the Z direction. Accordingly, similar to FIG. 5, the (111) plane having an angle θ of 54.7 degrees with respect to the (100) plane is precipitated, and two (111) planes come into contact with each other, so that the etching is stopped. The two side surfaces 41a of the long groove 41 are also etched toward the plus side or the minus side in the X direction to precipitate the (111) plane having the angle θ of 54.7 degrees with respect to the (100) plane, and two (111) planes come into contact with each other, so that the etching is stopped.

An etching depth S of the side surface 41a can be calculated based on Formula (2).

$$S = d1/(2 \times \tan 54.7) = 0.354 \times d1 \quad (2)$$

Therefore, when an interval between the two adjacent long grooves 41 is w, a condition under which the two adjacent long grooves 41 communicate with each other by etching is w/2<S, and thus Formula (3) is derived from Formula (2).

$$0.354 \times d1 \times 2 > w \quad (3)$$

Since calculation of an etching depth of the bottom surface 41b having the (100) plane is the same as that of Formula (1), an etching depth d2 of the silicon substrate 10 in the Z direction can be calculated based on Formula (4).

$$d2 = d1 + 0.706 \times L \quad (4)$$

Therefore, as a condition under which the silicon substrate 10 having a thickness of t is not penetrated in a thickness direction by etching, Formula (5) is derived from Formula (4).

$$d1 + 0.706 \times L < t \quad (5)$$

Figure 8:
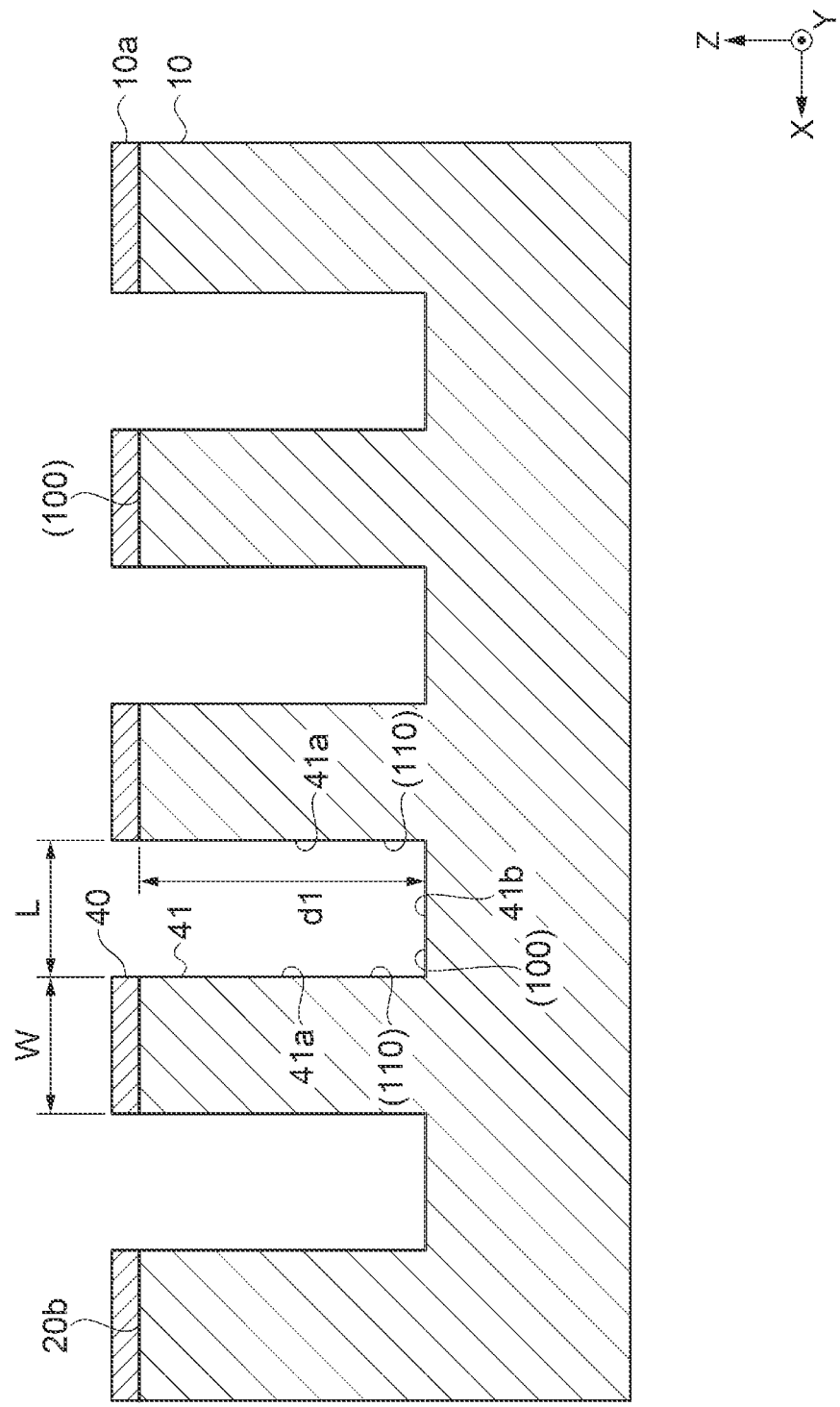
FIG. 8 is a cross-sectional view illustrating an etching characteristic of a silicon substrate used in the vibrator device according to the present embodiment.
Figure 9:
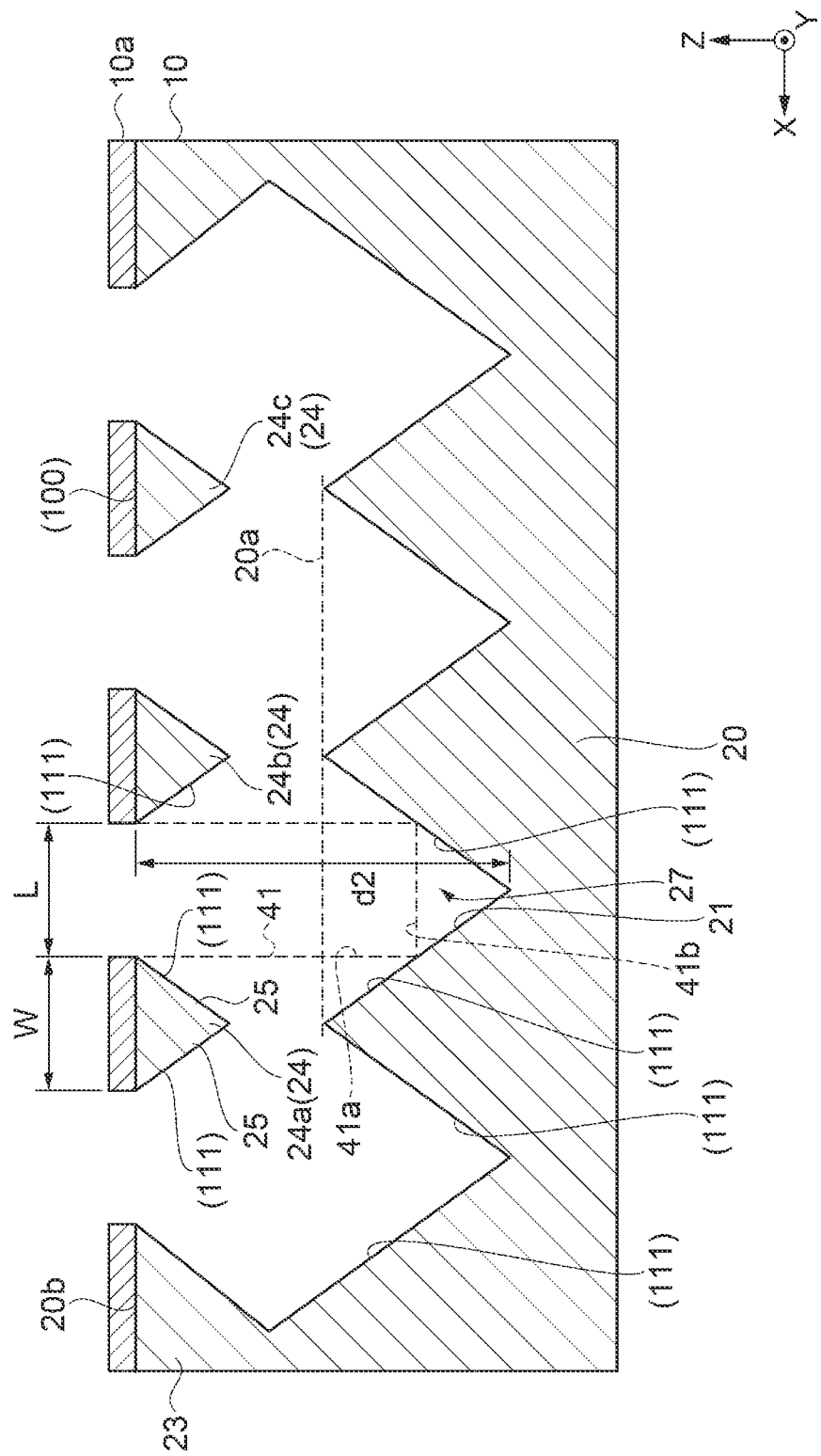
FIG. 9 is a cross-sectional view illustrating an etching characteristic of a silicon substrate used in the vibrator device according to the present embodiment.

By using such an etching mechanism, the silicon substrate 10 is subjected to wet etching. The silicon substrate 10 is obtained by dry etching plural long grooves 41, as shown in FIG. 8, having the predetermined interval W, the length L of the opening portion 40, and the length d1 to the bottom surface 41b. As a result, the side surfaces 41a of the adjacent long grooves 41 are etched to communicate with each other between the second surface 20b of the silicon substrate 10 and the bottom surfaces 41b of the long grooves 41. As shown in FIG. 9, in a cross-sectional view from the Y direction, the vibrating arms 24 each having a triangular shape cross section are formed, and internal spaces 27 which are cavities are formed below the vibrating arms 24.

In FIG. 9, when a width of the first vibrating arm 24a is W, a distance between the first vibrating arm 24a and the second vibrating arm 24b is L, and a distance from the second surface 20b of the vibrating arm 24 to the recessed portion 21 of the first surface 20a is d2, and W, L, and d2 represent conditions under which the two adjacent long grooves 41 communicate with each other by etching, Formula (6) is obtained.

$$(W/0.708) + 0.706 \times L < d2 \quad (6)$$

1.3 Method for Manufacturing Vibrator Device

Next, a method for manufacturing the vibrator device 1 according to the first embodiment will be described with reference to FIGS. 10 to 16.

Figure 10:
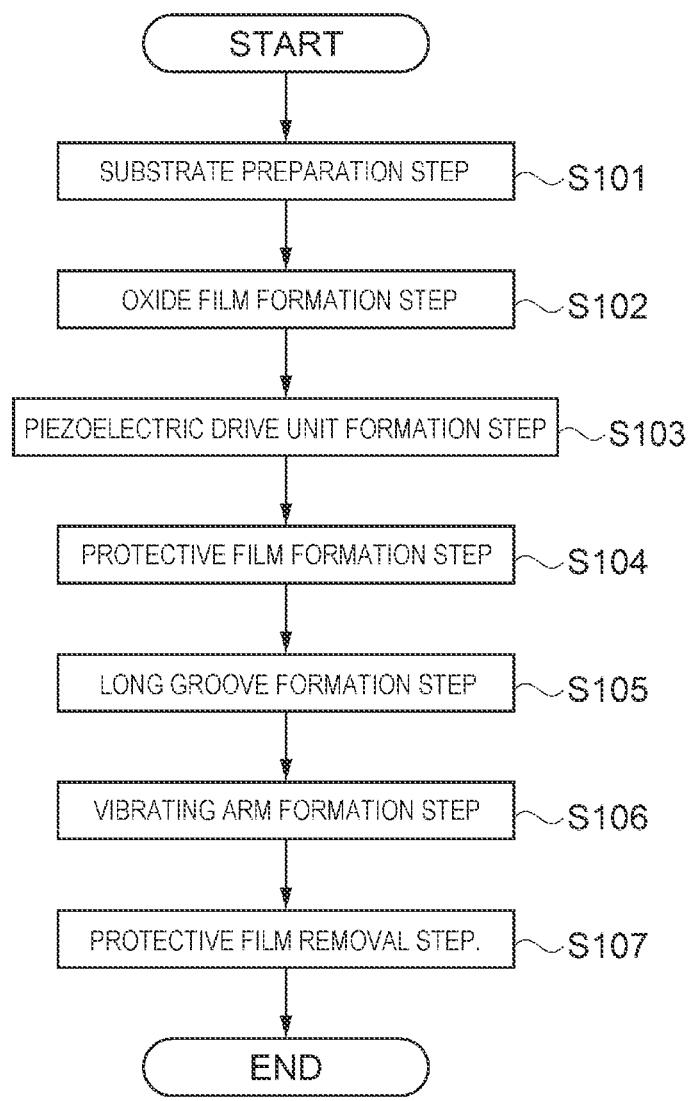
FIG. 10 is a flowchart showing a vibrator device manufacture method.

As shown in FIG. 10, the method for manufacturing the vibrator device 1 according to the present embodiment includes a substrate preparation step, an oxide film formation step, a piezoelectric drive unit formation step, a protective film formation step, a long groove formation step, a vibrating arm formation step, and a protective film removal step.

1.3.1 Substrate Preparation Step

First, in step S101, the single crystal silicon substrate 10 having a flat plate shape is prepared.

1.3.2 Oxide Film Formation Step

Figure 11:
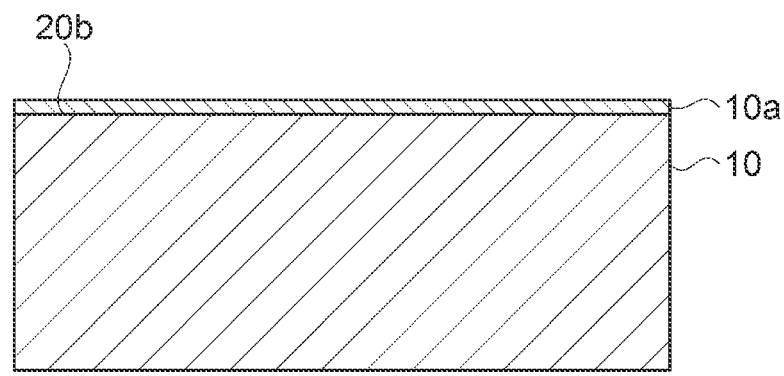
FIG. 11 is a cross-sectional view showing a method for manufacturing the vibrator device.
Figure 11:
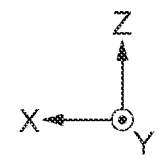

In step S102, as shown in FIG. 11, the silicon substrate 10 is thermally oxidized to form, at the second surface 20b that is one surface of the silicon substrate, the oxide film 10a made of a silicon oxide (SiO$_2$) film that protects a region not to be etched when the silicon substrate 10 is subjected to the etching process.

1.3.3 Piezoelectric Drive Unit Formation Step

Figure 12:
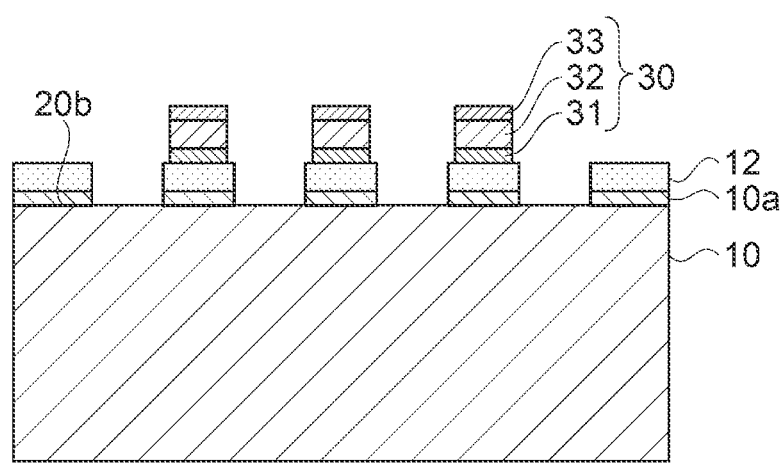
FIG. 12 is a cross-sectional view showing the method for manufacturing the vibrator device.
Figure 12:
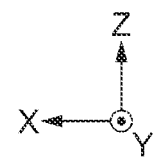

In step S103, the temperature characteristic adjusting film 12 which is a silicon oxide film is formed on the oxide film 10a based on a sputtering method or a CVD method, and the oxide film 10a and the temperature characteristic adjusting film 12 are patterned into a shape of the vibrator device 1 based on a photolithography technique and an etching technique. Thereafter, the first electrode 31, the piezoelectric film 32, and the second electrode 33 that form the piezoelectric drive unit 30 are formed and patterned in this order on the temperature characteristic adjusting film 12 to form the piezoelectric drive unit 30 as shown in FIG. 12. Since the oxide film 10a also has a temperature characteristic adjusting function, the temperature characteristic adjusting film 12 may be omitted due to the oxide film 10a also serving as the temperature characteristic adjusting film 12, and in that case, the piezoelectric drive unit 30 is formed on the oxide film 10a.

Details of the method for forming the piezoelectric drive unit 30 are as follows. First, the first electrode 31 made of titanium nitride (TiN) or the like is formed based on the sputtering method, and a shape of the piezoelectric drive unit 30 is patterned based on the photolithography technique and the etching technique. Next, asking treatment with oxygen gas is performed to turn a surface of titanium nitride into amorphous titanium nitride oxide (TiON). Next, the piezoelectric film 32 made of aluminum nitride (AlN) or the like is formed on the titanium nitride oxide (TiON) film based on the sputtering method, and the shape of the piezoelectric drive unit 30 is patterned based on the photolithography technique and the etching technique. Therefore, the piezoelectric drive unit formation step includes a step of forming the piezoelectric film 32 on a surface on which the vibrating arms 24 are formed on the second surface 20b. Thereafter, the second electrode 33 made of titanium nitride or the like is formed on the piezoelectric film 32 based on the sputtering method, and the shape of the piezoelectric drive unit 30 is patterned based on the photolithography technique and the etching technique.

1.3.4 Protective Film Formation Step

Figure 13:
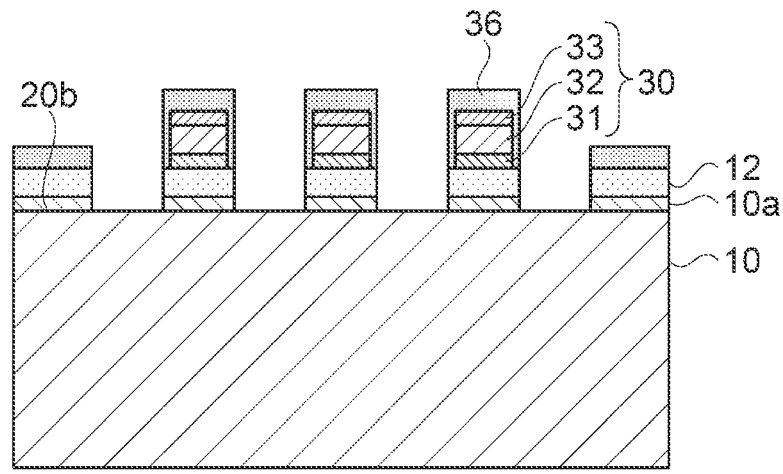
FIG. 13 is a cross-sectional view showing the method for manufacturing the vibrator device.
Figure 13:
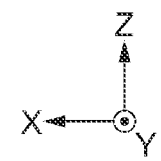

In step S104, as shown in FIG. 13, in order to protect the piezoelectric film 32 of the piezoelectric drive unit 30 from the alkaline aqueous solution (KOH, TMAH) for etching the silicon substrate 10, a protective film 36 which is a silicon oxide film is also formed at side walls of the piezoelectric drive unit 30 based on the sputtering method or the CVD method, and the shape of the vibrator device 1 is patterned based on the photolithography technique and the etching technique.

1.3.5 Long Groove Formation Step

Figure 14:
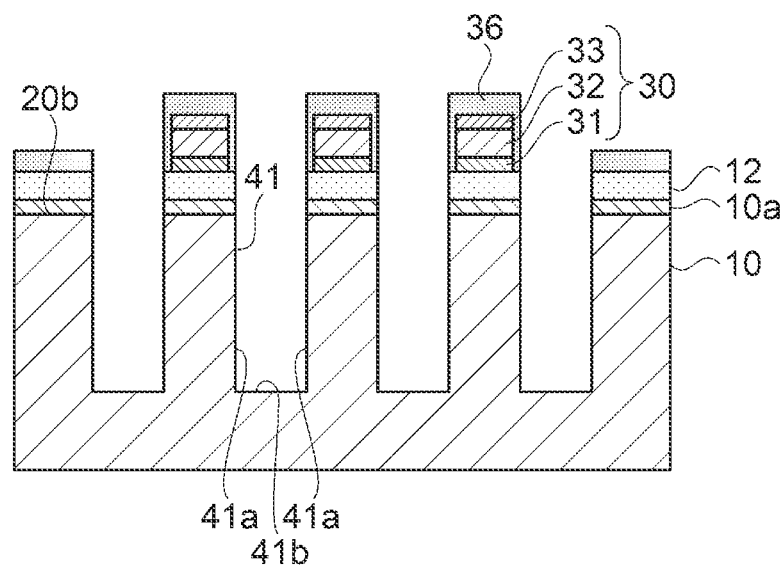
FIG. 14 is a cross-sectional view showing the method for manufacturing the vibrator device.
Figure 14:
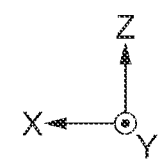

In step S105, as shown in FIG. 14, at least two bottomed long grooves 41 arranged at a predetermined interval are formed at the second surface 20b which is one surface of the silicon substrate 10. In the present embodiment, four long grooves 41 are formed in order to form three vibrating arms 24. When this step is described in more detail, regions of the silicon substrate 10 that are exposed from the oxide film 10a, the temperature characteristic adjusting film 12, and the protective film are subjected to the dry etching to form grooves including the long groove 41 having a desired depth. In the present embodiment, in the shape of the vibrator device 1, the groove between the vibrating arm 24 and the vibrating arm 24 is particularly referred to as the long groove 41 and will be described.

In step S105, the side surface 41a of the formed long groove 41 is the (110) plane of the silicon substrate 10, and the bottom surface 41b is the (100) plane of the silicon substrate 10.

1.3.6 Vibrating Arm Formation Step

Figure 15:
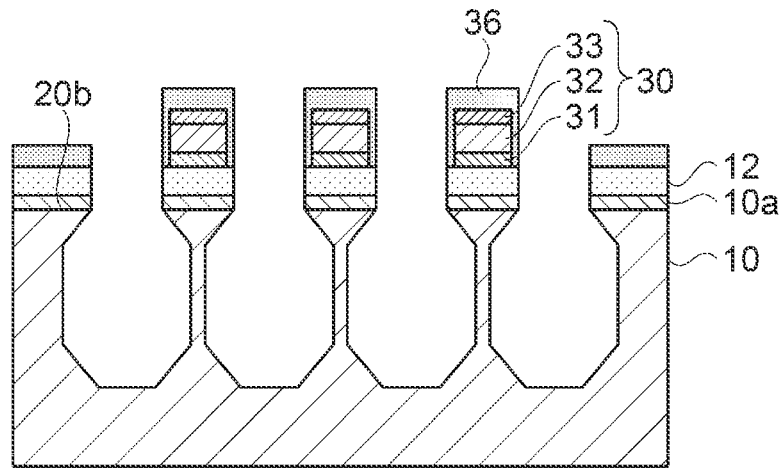
FIG. 15 is a cross-sectional view showing the method for manufacturing the vibrator device.
Figure 15:
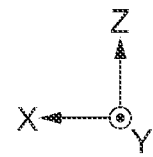
Figure 16:
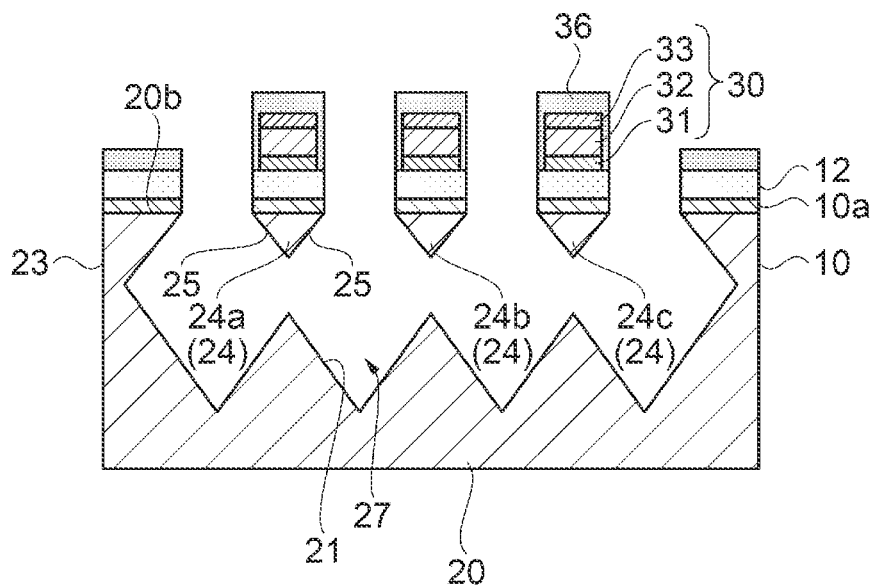
FIG. 16 is a cross-sectional view showing the method for manufacturing the vibrator device.
Figure 16:
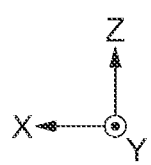

In step S106, the side surfaces 41a of the long groove 41 are subjected to the wet etching to communicate the two long grooves 41 with each other, thereby forming the vibrating arm 24 between the second surface 20b and the bottom surface 41b of the long groove 41 in the Z direction which is the thickness direction of the silicon substrate 10. More specifically, the grooves including the long grooves 41 are subjected to the wet etching using the alkaline aqueous solution (KOH, TMAH) to make the side surfaces 41a of the two long grooves 41 communicate with each other, thereby forming cavities below the vibrating arms 24. During the etching, as shown in FIG. 15, the side surfaces 41a and the bottom surfaces 41b of the long groove 41 are etched, and the (111) plane having the angle θ of 54.7 degrees with respect to the (100) plane illustrated in FIG. 7 is precipitated. When the etching is performed until the precipitated (111) planes come into contact with each other, as shown in FIG. 16, the internal spaces 27 are formed below the vibrating arms 24, and the vibrating arms 24 each having a triangular shape cross section from the Y direction are formed.

In step S106, the formed vibrating arm 24 has two side surfaces 25 that are coupled to two ends of the second surface 20b, and the two side surfaces 25 gradually approach each other as the distance from the second surface 20b to the side surface 25 increases. The two side surfaces 25 are the (111) planes of the silicon substrate 10.

1.3.7 Protective Film Removal Step

In step S107, by removing the protective film 36 with hydrofluoric acid (HF), it is possible to obtain the vibrator device 1 as shown in FIG. 3 in which the internal spaces 27 are present below the vibrating arms 24 and the vibrating arms 24 each have a triangular shape cross section from the Y direction.

As described above, based on the method for manufacturing the vibrator device 1 according to the present embodiment, it is possible to manufacture the vibrator device 1 by etching the inexpensive single crystal silicon substrate 10, and thus obtain the low-priced vibrator device 1.

In the present embodiment, four long grooves 41 are formed in order to form three vibrating arms 24. However, the present disclosure is not limited thereto, and at least two bottomed long grooves 41 arranged at a predetermined interval may be formed to form the vibrator device 1.

2. Second Embodiment

Next, a vibrator device 1a according to a second embodiment will be described with reference to FIGS. 17 and 18. Parts common to those according to the first embodiment are denoted by the same reference numerals, and detailed description thereof is omitted. Parts different from those according to the first embodiment will be mainly described.

Figure 17:
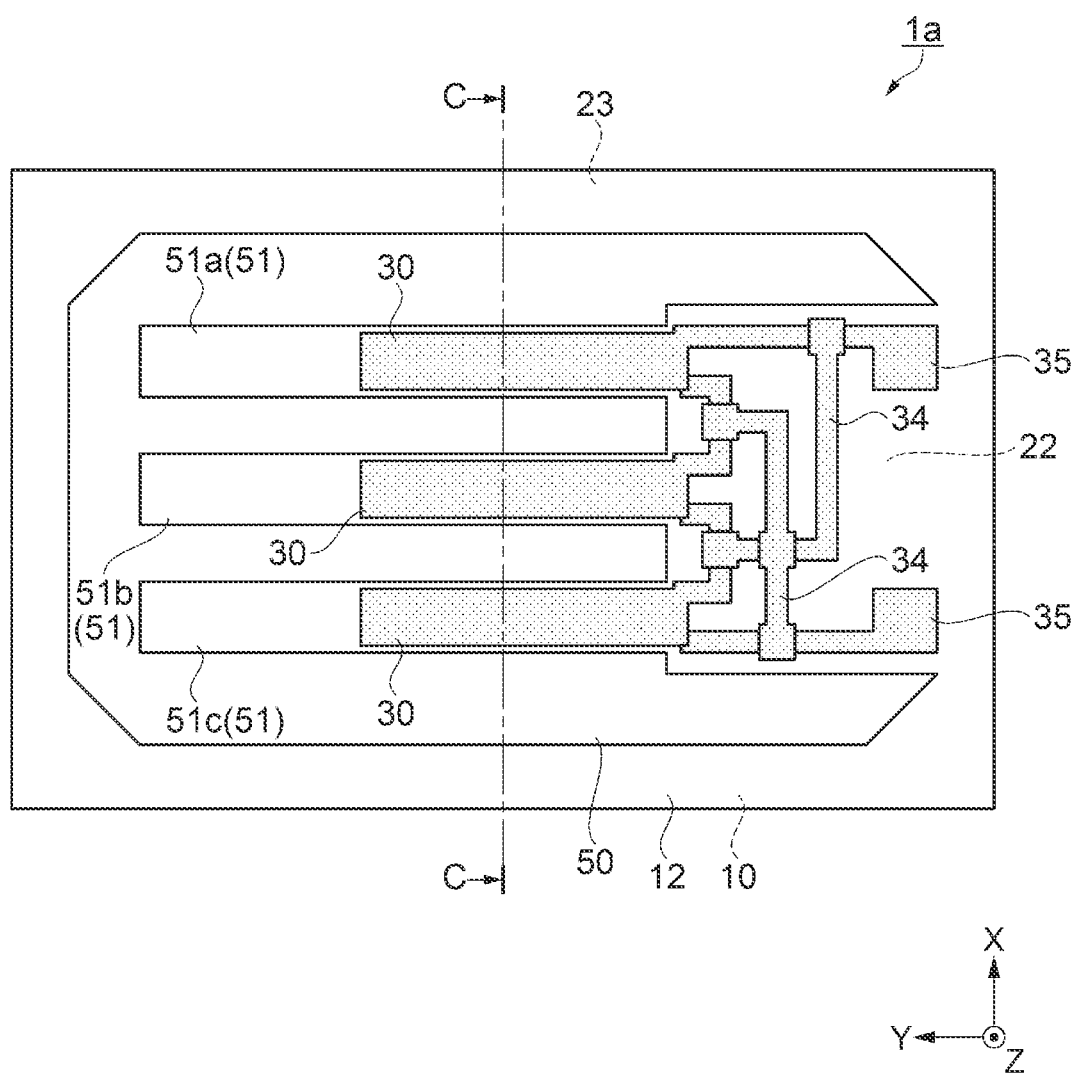
FIG. 17 is a plan view showing a schematic configuration of a vibrator device according to a second embodiment.
Figure 18:
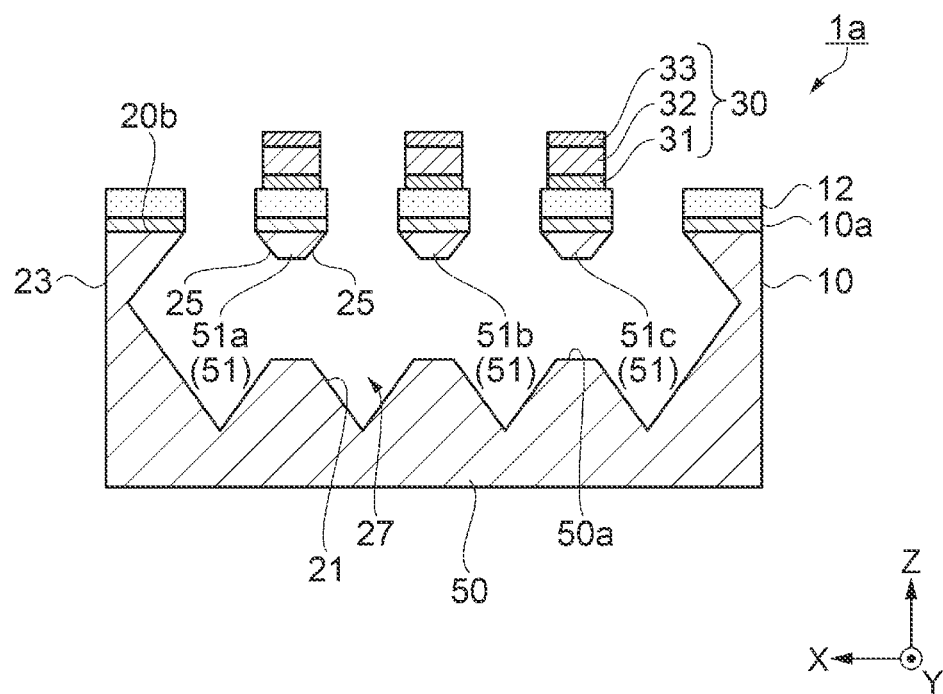
FIG. 18 is a cross-sectional view taken along a line C-C in FIG. 17.

As shown in FIGS. 17 and 18, the vibrator device 1a according to the second embodiment is different from the vibrator device 1 according to the first embodiment in a cross-sectional shape of each vibrating arm 51 and a shape of a first surface 50a.

As shown in FIG. 17, the vibrator device 1a is the same as the vibrator device 1 according to the first embodiment in a plan view from the Z direction. However, as shown in FIG. 18, in a cross-sectional view from the Y direction, the cross-sectional shape of each vibrating arm 51 is a trapezoidal shape, and cross-sectional shapes of a first vibrating arm 51a, a second vibrating arm 51b, and a third vibrating arm 51c are the same. In a base portion 50, a protruding portion on the second surface 20b side formed by two recessed portions 21 has a trapezoidal shape, and an upper side of the trapezoidal shape is the first surface 50a having a constant gap with the vibrating arms 51.

As a method for manufacturing the vibrator device 1a according to the present embodiment, in the above-described vibrating arm formation step, the wet etching is continually performed for a desired time after the side surfaces 41a of the two long grooves 41 communicate with each other, so that the cross section of each vibrating arm 51 can be formed in a trapezoidal shape. This is because the (100) plane is precipitated by performing the etching for a long time on a portion where the (111) planes constituting the side surfaces 25 of the vibrating arm 51 come into contact with each other. Therefore, the first surface 50a and opposite-side surfaces of the vibrating arms 51 from the second surface 20b form the (100) plane. The "trapezoidal shape" includes not only a case in which an upper side and a lower side of the trapezoidal shape are each a straight line and are parallel to each other, but also a case in which the upper side and the lower side of the trapezoidal shape are slightly deviated from the straight line or being parallel to each other within a range that can be regarded as the same as the straight line or being parallel to each other in a common technical sense.

With such a configuration, the same effects as those of the vibrator device 1 according to the first embodiment can be attained. Since rigidity of the vibrating arm 51 in the Z direction is weakened, it is possible to easily perform the flexural vibration in which the vibrating arms 51 displace in the Z direction orthogonal to the second surface 20b, and it is possible to obtain the vibrator device 1a having stable vibration.

What is claimed is:

1. A vibrator device comprising:
    a base portion having a first surface of which a recessed portion is formed on a surface of the base portion,
    a support portion protruding from the first surface in a normal direction of the first surface;
    a vibrating arm that extends from the support portion along the first surface and that has a gap with the first surface; and
    a piezoelectric film disposed at a second surface that is an opposite-side surface from a surface facing the first surface of the vibrating arm, wherein
    the vibrating arm is made of a single crystal silicon substrate,
    the vibrating arm includes two side surfaces that are coupled to two ends of the second surface in a width direction of the vibrating arm, and
    the two side surfaces gradually approach each other as a distance from the second surface to the side surface increases.

2. The vibrator device according to claim 1, wherein
    the vibrating arm includes a first vibrating arm and a second vibrating arm that are arranged along the first surface, and $$(W/0.708)+0.706 \times L < d2,$$

a width of the first vibrating arm is W,
    a distance between the first vibrating arm and the second vibrating arm is L, and
    a distance from the second surface of the vibrating arm to the recessed portion of the first surface is d2.

3. The vibrator device according to claim 1, wherein
a cross section of the vibrating arm has a trapezoidal shape in a cross-sectional view from an extending direction of the vibrating arm.

* * * * *